(12) United States Patent
Hill et al.

(10) Patent No.: US 10,617,036 B2
(45) Date of Patent: Apr. 7, 2020

(54) APPARATUSES, SYSTEMS, AND METHODS FOR IMPROVED HEAT DISSIPATION

(71) Applicant: Microsoft Technology Licensing, LLC, Redmond, WA (US)

(72) Inventors: Andrew Hill, Redmond, WA (US); Robyn Rebecca Reed McLaughlin, Seattle, WA (US); James Michael Bonicatto, Seattle, WA (US); Kenneth Charles Boman, Duvall, WA (US); Jeffrey Taylor Stellman, Seattle, WA (US); Avi Pinchas Hecht, Mountain View, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/259,462

(22) Filed: Jan. 28, 2019

(65) Prior Publication Data
US 2019/0269037 A1 Aug. 29, 2019

Related U.S. Application Data

(63) Continuation of application No. 15/903,817, filed on Feb. 23, 2018, now Pat. No. 10,225,955.

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/20* | (2006.01) | |
| *G06F 1/20* | (2006.01) | |

(52) U.S. Cl.
CPC ........... *H05K 7/20409* (2013.01); *G06F 1/20* (2013.01); *G06F 1/203* (2013.01); *H05K 7/20336* (2013.01); *H05K 7/20381* (2013.01); *H05K 7/20481* (2013.01); *H05K 7/20945* (2013.01)

(58) Field of Classification Search
CPC .......... H05K 7/20409; H05K 7/20336; H05K 7/20381; H05K 7/204781; H05K 7/20945
USPC ................ 361/719, 718, 720, 721, 717, 715
See application file for complete search history.

(56) References Cited

U.S. PATENT DOCUMENTS

| | | | | |
|---|---|---|---|---|
| 6,257,328 B1* | 7/2001 | Fujiwara | ................. | F28F 13/00 165/185 |
| 9,379,039 B2* | 6/2016 | Lam | ...................... | H01L 23/473 |
| 9,405,335 B1* | 8/2016 | Boilard | ..................... | G06F 1/20 |
| 2014/0340841 A1* | 11/2014 | Yu | ........................... | G06F 1/203 361/679.47 |

* cited by examiner

*Primary Examiner* — Anthony M Haughton
(74) *Attorney, Agent, or Firm* — Ray Quinney & Nebeker P.C.; Paul N. Taylor

(57) ABSTRACT

A computing device includes a housing having an inner surface, a first outer surface, a second outer surface, and a side extending between the first outer surface and the second outer surface. The computing device also includes a heat generating electronic device, a first heat spreader, and a second heat spreader. At least a portion of the first heat spreader abuts or is adjacent to the inner surface of the housing. The second heat spreader extends from a first position within the housing, at or adjacent to the heat generating electronic device to a second position within the housing. The second position is closer to the side of the housing than the first position. A first portion of the second heat spreader abuts the first heat spreader, and a second portion of the second heat spreader is at a distance from the first heat spreader.

20 Claims, 5 Drawing Sheets

APPARATUSES, SYSTEMS, AND METHODS FOR IMPROVED HEAT DISSIPATION

CROSS-REFERENCE TO RELATED APPLICATIONS

This application is a continuation of U.S. patent application Ser. No. 15/903,817, filed Feb. 23, 2018, which is hereby incorporated by reference in its entirety.

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
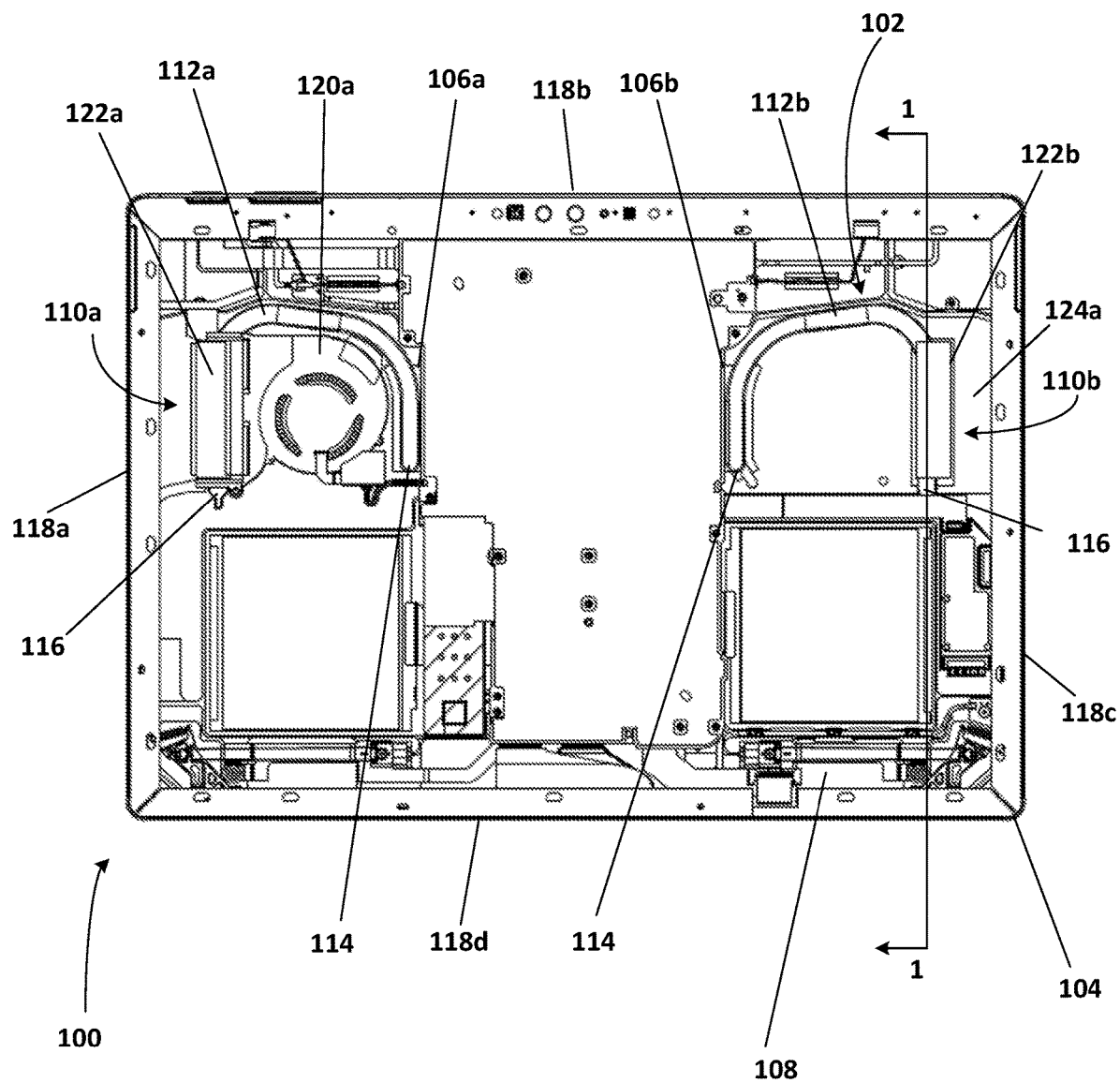
FIG. 1 is a top view of a computing device including an example of a thermal management system.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. Conductive heat transfer from the processor (and/or thermal management devices adjacent to or in physical contact with the processor) to a housing (e.g., an underside of a touch display module) of the computing device aids in the removal of heat from the processor. Conductive, convective, and/or radiative heat transfer from the housing to the surroundings of the computing device aids in the removal of heat from the computing device.

The highest thermal efficiency for a computing device (e.g., a fanless computing device) occurs when all exterior surfaces of the computing device are isothermal. The exterior surfaces of the computing device being at an isothermal temperature maximizes passive heat transfer (e.g., in the presence of a buoyancy driven flow) from the computing device. Processing speeds for the computing device may be controlled based on the isothermal temperature, not hotspot temperatures, thus allowing the computing device to run faster and/or at a higher power.

Disclosed herein are apparatuses, systems, and methods for improved heat dissipation from an electronic device. The improved heat dissipation within an electronic device may be implemented by providing a direct conduction path from a heat generating device within the electronic device (e.g., a processor) to peripheries of enclosures (e.g., a display module and a chassis of the housing) of the electronic device. For example, a heat pipe and/or a vapor chamber may be used to transfer heat away from the processor and towards edges of the enclosures. The heat pipe and/or the vapor chamber is in thermal communication with heat spreaders (e.g., graphite heat spreaders) at or adjacent to the one or more edges of the enclosures. A portion of the heat pipe and/or the vapor chamber is not in physical contact with either of the heat spreaders. The heat spreaders are attached to and in thermal communication with the enclosures, respectively. The heat spreaders help disperse heat transferred from the processor, for example, across outer surfaces of the electronic device (e.g., surfaces of the display module and the chassis).

The heat pipe and/or the vapor chamber may be directly attached to the heat spreaders at or adjacent to the edges of the enclosures, respectively. Alternatively, the heat pipe and/or the vapor chamber is part of a thermal module that includes one or more additional thermal management devices (e.g., one or more layers of thermally conductive material or one or more heat sinks), and the thermal module is attached to the heat spreaders at or adjacent to the edges of the enclosures, respectively, via the one or more additional thermal management devices and/or the heat pipe and/or the vapor chamber.

For each of the heat spreaders, a layer of insulating material is disposed between the respective heat spreader and the respective enclosure (e.g., the display module or the chassis) in a respective area where, for example, the thermal module contacts the respective heat spreader. The layers of insulating material aid in the reduction of localized hot spots on the outer surfaces of the electronic device, respectively.

As an example, the improved heat dissipation within a computing device may be implemented by providing a housing having an inner surface, a first outer surface, a second outer surface, and at least one side extending between the first outer surface and the second outer surface. A heat generating electronic device is supported by the housing. A first heat spreader is supported by the housing. At least a portion of the first heat spreader abuts or is adjacent to the inner surface of the housing. A second heat spreader is supported by the housing. The second heat spreader extends from a first position within the housing, at or adjacent to the heat generating electronic device to a second position within the housing. The second position is closer to a side of the at least one side of the housing than the first position. A first portion of the second heat spreader abuts the first heat spreader, and a second portion of the second heat spreader is at a distance from the first heat spreader, such that the second portion of the second heat spreader does not abut the first heat spreader.

Such heat dissipation apparatuses or systems have several potential end-uses or applications, including any electronic device having a passive or an active cooling component (e.g., fan). For example, the heat dissipation system may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, or a combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, an audio and/or video media player, or another computing device.

The computing device 100 includes a housing 104 that supports at least the thermal management system 102 and one or more heat generating components 106 (e.g., a first heat generating component 106a and a second heat generating component 106b). The heat generating component 106 may be any number of electrically powered devices including, for example, a processor, memory, a power supply, a graphics card, a hard drive, or another electrically powered device. The first heat generating component 106a (e.g., a processor) and the second heat generating component 106b (e.g., a processor) may be supported by the housing 104 via, for example, a printed circuit board (PCB) 108 attached to and/or supported by the housing 104. The processor 106 is in communication with other electrical devices or components of the computing device 100 via the PCB 108, for example. The computing device 100 may include a number of components not shown in FIG. 1 (e.g., a hard drive, a power supply, connectors).

The thermal management system 102 includes one or more thermal management modules 110 corresponding to heat generating components for which heat is to be transferred to a periphery of the computing device 100. In the example shown, the thermal management system 102 includes two thermal management modules (e.g., a first thermal management module 110a corresponding to the first processor 106a and a second thermal management module 110b corresponding to the second processor 106b). In other examples, the thermal management system 102 includes more or fewer thermal management modules 110 corresponding to more or fewer heat generating components. In one example, more than one thermal management module 110 corresponds to a single heat generating component. For example, two or more heat spreaders 112 extend away from a single heat generating component 106 to positions at or adjacent to the periphery of the computing device 100, respectively.

Each of the thermal management modules 110 includes a heat spreader 112 (e.g., a first heat spreader 112a and a second heat spreader 112b). The heat spreaders 112 of the thermal management modules 110 are supported by the housing 104. In one example, the heat spreaders 112 are supported by the housing 104 via other components of the computing device 100 (e.g., the processors 106). In another example, the heat spreaders 112 are supported by the housing 104 via one or more connectors such as, for example, screws and threaded bosses, tabs, flanges, other connectors, or any combination thereof.

In the example shown in FIG. 1, the first heat spreader 112a and the second heat spreader 112b are phase change devices (e.g., a heat pipe or a vapor chamber). The internal structure of a heat pipe or vapor chamber affects performance of the phase change device. Features that affect phase change performance include vapor space and capillary features. The vapor space is a path for evaporated working fluid to travel to a condenser, and the capillary features are a pathway for condensed working fluid to return to an evaporator.

In other examples, each of the heat spreaders 112 includes one or more heat pipes, one or more vapor chambers, one or more layers of thermally conductive material (e.g., a solid piece of copper or graphite), or any combination thereof. The heat spreaders 112 may be made of any number of materials including, for example, copper, aluminum, titanium, another thermally conducting material, or any combination thereof.

Each of the heat spreaders 112 includes a first end 114 and a second end 116. The first end 114 of the respective heat spreader 112 is in physical contact with and/or adjacent to the respective processor 106. For example, the first end 114 of the first heat spreader 112a is in physical contact with and/or adjacent to the first processor 106a, and the first end 114 of the second heat spreader 112b is in physical contact with and/or adjacent to the second processor 106b. The first end 114 of the respective heat spreader 112 may be adjacent to the respective processor 106 in that the first end 114 of the respective heat spreader 112 is physically connected to the respective processor 106 via one or more layers of a material (e.g., a layer of thermal adhesive) or one or more components (e.g., a phase change device or a cold plate).

For example, the first end 114 of the respective heat spreader 112 is adjacent to the respective processor 106 in that the first end 114 of the respective heat spreader 112 is physically connected to the respective processor 106 via a phase change device such as, for example, a vapor chamber. In other words, the vapor chamber abuts the respective processor 106, and the respective heat spreader 112 abuts the vapor chamber. In another example, the first end 114 of the respective heat spreader 112 may be adjacent to the respective processor 106 in that the heat spreader 112 abuts the processor 106, but the first end 114 of the heat spreader 112 is beyond the processor 106 (e.g., less than 2.0 cm beyond the processor 106). In another example, the respective heat spreader 112 extends between the respective processor 106 and the periphery of the computing device 100, but the first end 114 of the heat spreader 112 is at a distance from the processor 106.

The respective heat spreader 112 extends away from a position (e.g., a first position) within the housing 104 at or adjacent to the respective processor 106 to a position (e.g., a second position) within the housing 104 at or adjacent to the periphery of the computing device 100. The housing 104 includes one or more sides 118 extending between a first outer surface and a second outer surface (see FIG. 2). As shown in the example of FIG. 1, the housing 104 may be rectangular in shape and may include four sides 118 (e.g., a first side 118a, a second side 118b, a third side 118c, and a fourth side 118d; with rounded corners). In other examples, the housing 104 may be any number of other shapes with more or fewer sides 118. The respective heat spreader 112 extends away from the respective first position within the housing 104 to the respective second position within the housing 104, which is at or adjacent to a respective side 118 of the housing 104. The second position within the housing 104 may be adjacent to the side 118 of the housing 104 in that the second position within the housing 104 is closer to the respective side 118 than the first position within the housing 104.

In the example shown in FIG. 1, the first heat spreader 112a extends between a first position within the housing 104 at the first processor 106a to a second position adjacent to the first side 118a of the housing 104. The second heat spreader 112b extends between a first position within the housing 104 at the second processor 106b to a second position adjacent to the third side 118c of the housing 104. Additional, fewer, and/or different heat spreaders 112 may extend from additional, fewer, and/or different positions within the housing 104 towards additional, fewer, and/or different sides 118 of the housing 104.

A path of a respective heat spreader 112 (e.g., between the respective first position and second position within the housing 104) towards the periphery of the computing device 100 may be device-specific. The paths of the heat spreaders, the number of heat spreaders, the size of the heat spreaders, and/or other configurations may be optimized to best spread heat generated within the computing device 100 with the goal of isothermal outer surfaces of the computing device 100. In other words, the thermal management modules 110 may be configured to balance a thermal resistance network within the computing device 100.

In the example shown in FIG. 1, the path of the first heat spreader 112a (e.g., a first path) and the path of the second heat spreader 112b (e.g., a second path) are configured to accommodate one or more fans 120 (e.g., a first fan 120a adjacent to the first heat spreader 112a). In another example, the computing device 100 does not include a fan, and the first path and the second path are more direct routes to the first side 118a and the second side 118b, respectively.

In one example, each of the thermal management modules 110 includes a heat sink 122. The heat sink 122 is attached to the heat spreader 112 of the respective thermal management module 110 in any number of ways including, for example, by a press fit, with a thermal adhesive, solder, another connector, or any combination thereof. Alternatively, the heat sink 122 is formed integrally with the heat spreader 112 of the respective thermal management module 110. The respective heat sink 122 provides an extended surface area for heat rejection out of the computing device 100. The respective heat sink 122 may include any number of fins that are any number of shapes (e.g., pin fins), sizes, and have any number of positions relative to the respective heat spreader 112. All of the thermal management modules 110 of the thermal management system 102 may include heat sinks 122 or less than all of the thermal management modules 110 of the thermal management system 102 may include heat sinks 122. In one example, the computing device does not include any fans, and the thermal management modules 110 of the thermal management system 102 do not include heat sinks.

The respective heat sink 122 is, for example, positioned at or adjacent to the second end 116 of the heat spreader 112 of the respective thermal management module 110. The heat sink 122 extends from a position at or adjacent to the second end 116 of the heat spreader 112 of the respective thermal management module 110 towards the first end 114 of the heat spreader 112, along the heat spreader 112. In the example shown in FIG. 1, the first thermal management module 110a includes a first heat sink 122a attached to the first heat pipe 112a adjacent to the second end 116 of the first heat pipe 112a. Exhaust air out of the first fan 120a moves through fins of the first heat sink 122a. The second thermal management module 110b includes a second heat sink 122b attached to the second heat pipe 112b adjacent to the second end 116 of the second heat pipe 112b. The computing device 100 does not include a fan adjacent to the second heat pipe 112b. Other configurations such as, for example, the computing device 100 including a second fan 120b adjacent to the second heat pipe 112b may be provided.

The thermal management system 102 also includes one or more heat spreaders 124. The one or more heat spreaders 124 are, for example, one or more layers of thermally conductive material (e.g., graphite, copper, aluminum, titanium, or another material), vapor chambers, or another type of heat spreader. In the example shown in FIG. 1, the thermal management system 102 includes two heat spreaders 124 that are layers of graphite (e.g., a first layer of graphite 124a and a second layer of graphite (see FIG. 2)). More or fewer heat spreaders 124 may be provided. For example, each of the thermal management modules 110 may include two corresponding heat spreaders 124.

Figure 2:
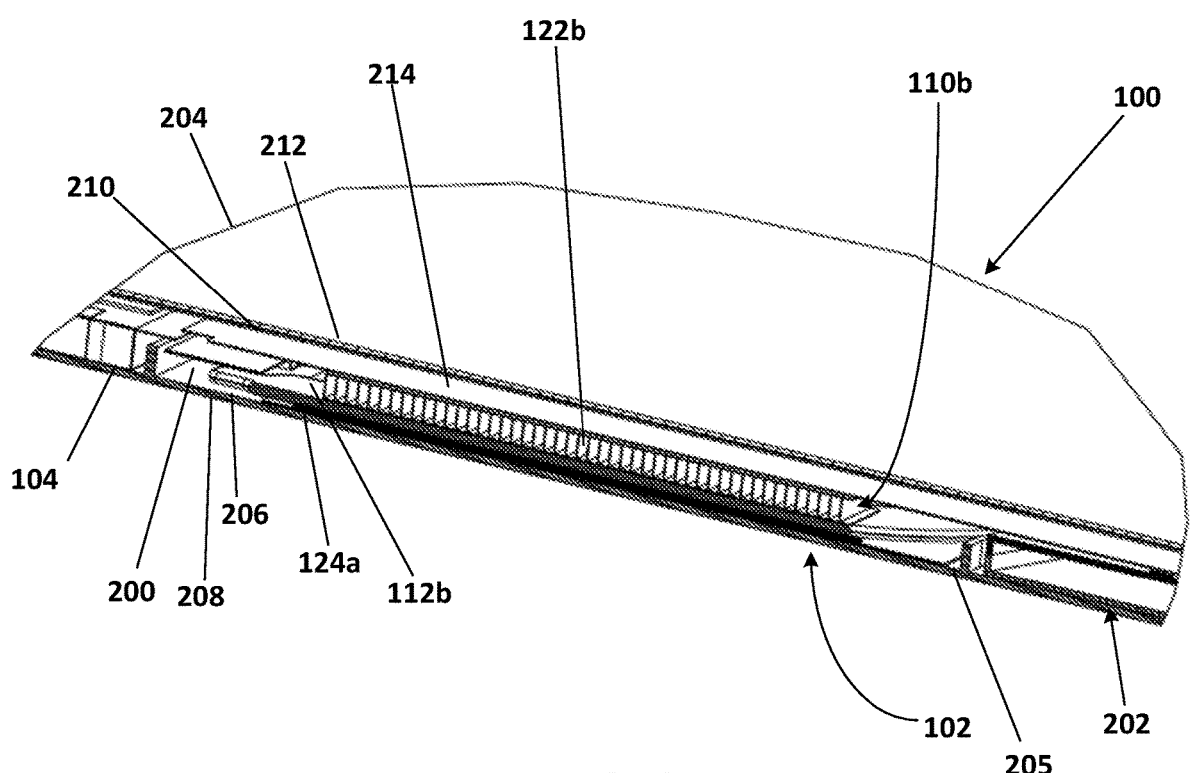
FIG. 2 is a perspective view of a cross section of a portion of the thermal management system of FIG. 1 taken along axis 1.

The first layer of graphite 124a and the second layer of graphite are disposed on inner surfaces within the computing device 100 that are opposite each other (see FIG. 2). In one example, the computing device 100 only includes one thermal spreader 124 disposed on one of the opposite inner surfaces within the computing device 100. The first layer of graphite 124a and the second layer of graphite spread heat around the opposite inner surfaces of the computing device 100 and, ultimately, around corresponding outer surfaces of the computing device 100.

The first layer of graphite 124a and the second layer of graphite may be any number of shapes and/or sizes. For example, the first layer of graphite 124a and the second layer of graphite may substantially match the size and/or shape of the opposite inner surfaces within the computing device 100, respectively. In one example, the first layer of graphite 124a and/or the second layer of graphite substantially cover the corresponding inner surface of the computing device 100. Substantial coverage may allow for differences in size and shape to accommodate other components within the computing device 100. In another example, the first layer of graphite 124a and/or the second layer of graphite cover less than all of the corresponding inner surface of the computing device 100.

The thermal management modules 110 are physically connected and in thermal communication with the heat spreaders 124 at or adjacent to the periphery of the computing device 100. For example, the first heat pipe 112a of the first thermal management module 110a extends from a position at or adjacent to the first processor 106a to a position adjacent to the first side 118a of the housing 104, and the first heat sink 122a and/or the first heat pipe 112a are physically and thermally connected to the first layer of graphite 124a and the second layer of graphite at and/or adjacent to the position adjacent to the first side 118a of the housing 104. For example, the first heat sink 122a may be physically connected to and in thermal communication with the first layer of graphite 124a and the second layer of graphite along all or part of the length of the first heat sink 122a, and the first heat pipe 112a may be physically connected to and in thermal communication with the first layer of graphite 124a at least along all or part of the length of the first heat sink 122a.

The second heat pipe 112b of the second thermal management module 110b extends from a position at or adjacent to the second processor 106b to a position adjacent to the third side 118c of the housing 104, and the second heat sink 122b and/or the second heat pipe 112b are physically and thermally connected to the first layer of graphite 124a and the second layer of graphite at and/or adjacent to the position adjacent to the second side 118c of the housing 104. For example, the second heat sink 122b may be physically connected to and in thermal communication with the first layer of graphite 124a and the second layer of graphite along all or part of the length of the second heat sink 122b, and a portion of the second heat pipe 112b may be physically connected to and in thermal communication with the first layer of graphite 124a at least along all or part of the length of the second heat sink 122b.

In one example, the first heat pipe 112a and the second heat pipe 112b do not abut the first layer of graphite 124a or the second layer of graphite other than at the connections along the first heat sink 122a and the second heat sink 122b, respectively. First portions of the first heat pipe 112a and the second heat pipe 112b, respectively, abut the first layer of graphite 124a and the second layer of graphite, and second portions of the first heat pipe 112a and the second heat pipe 112b, respectively, are spaced apart from the first layer of graphite 124a and the second layer of graphite, such that the second portions of the first heat pipe 112a and the second heat pipe 112b, respectively, do not abut the first layer of graphite 124a or the second layer of graphite.

Additional, fewer, and/or different parts of the thermal management modules 110 may be in physical contact (e.g., abut) and thermal communication with different parts of the first layer of graphite 124a and/or the second layer of graphite. For example, the thermal management modules 110 may not include heat sinks 122, and only the first heat pipe 112a and the second heat pipe 112b abut the first layer of graphite 124a and/or the second layer of graphite at and adjacent to second ends 116 of the first heat pipe 112a and the second heat pipe 112b, respectively. In another example, a thermal management module 110 includes layers of thermally conductive material (e.g., copper or graphite) at and adjacent to the second end 116 of the heat pipe 112 to physically and thermally connect the heat pipe 112 to the layers of graphite 124. The layers of thermally conductive material may be disposed on opposite sides of the heat pipe 112 and may be formed integrally with the heat pipe 112 or may be physically attached to the opposite sides of the heat pipe 112 (e.g., with a thermal adhesive). In yet another example, other portions of a heat pipe 112 between the first end 114 and the second end 116 (e.g., in the middle, between the first end 114 and the second end 116) of the heat pipe 112 may abut one or both of the layers of graphite 124. The number and locations of attachments of the thermal management modules 110 to the heat spreaders 124 depends on the particular computing device 100 and the balancing of the thermal resistance network to be achieved.

Figure 3:
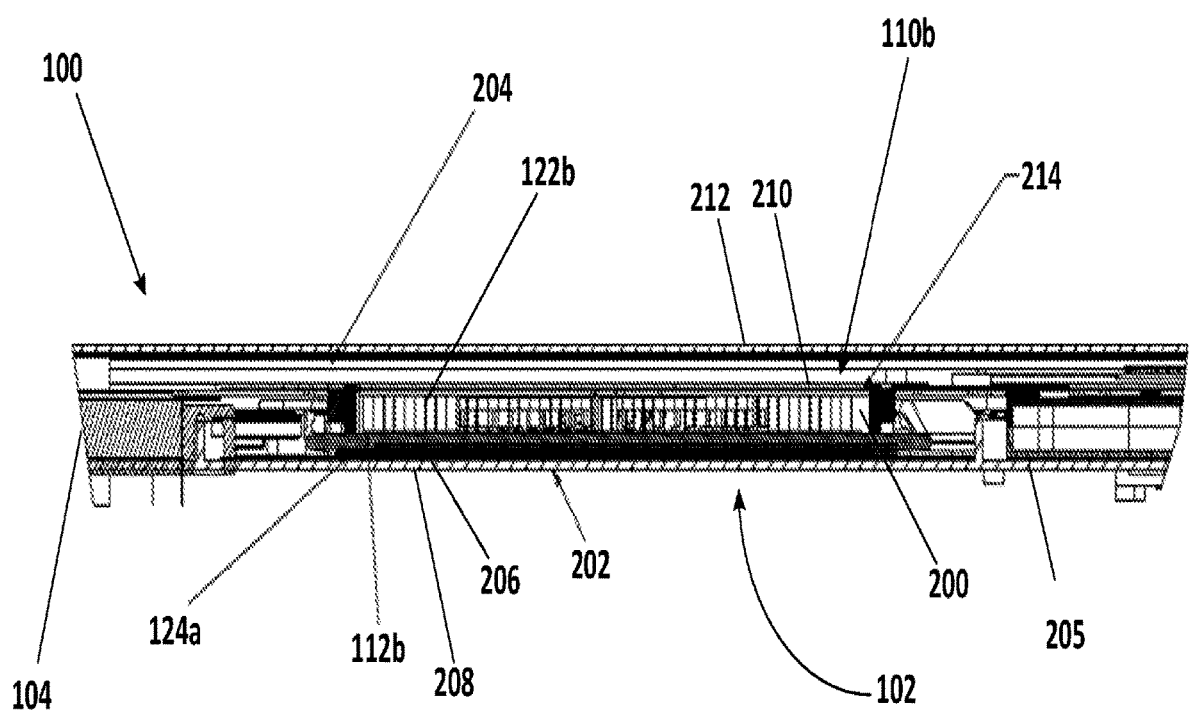
FIG. 3 is a cross section of a portion of a computing device including an example of a thermal management system.

FIG. 2 is a perspective view of a cross section of a portion of the thermal management system 102 of FIG. 1 taken along axis 1, and FIG. 3 is a cross section of a portion of the computing device 100 including an example of the thermal management system 102. The computing device 100 includes the housing 104 that defines an inner volume 200, in which the one or more heat generating components 106 (e.g., a processors) are supported by the PCB 108 (see FIG. 1). The PCB 108 may be supported by and/or fixed to the housing 104 in any number of ways including, for example, with tabs, flanges, connectors, an adhesive, or any combination thereof.

The housing 104 includes a chassis 202 (e.g., a bucket; only a portion shown). In the examples shown in FIGS. 2 and 3, the housing 104 also includes a display module 204 (e.g., of a touch display module). Only portions of the display module 204 are shown in FIGS. 2 and 3, respectively. In one example, the chassis 202 includes a backing layer 205 and the sides 118, which extend away from the backing layer 205, and the display module 204 abuts the sides 118 of the chassis 202, forming the inner volume 200.

The housing 104 includes a first inner surface 206 and a first outer surface 208 opposite the first inner surface 206 (e.g., partially forming the backing layer 205 of the chassis 202), and a second inner surface 210 and a second outer surface 212 opposite the second inner surface 210. The first inner surface 206 and the first outer surface 208 are surfaces of the chassis 202, and the second inner surface 210 and the second outer surface 212 are surfaces of the display module 204. The sides 118 (see FIG. 1) extend between the first outer surface 208 and the second outer surface 212.

The first heat spreader 124 (e.g., the first layer of graphite 124a) is physically connected to the first inner surface 206 (e.g., of the chassis 202), and the second heat spreader 124 (e.g., the second layer of graphite 214) is physically connected to the second inner surface 210 (e.g., of the display module 204). The first layer of graphite 124a and the second layer of graphite 214 may be directly connected to the first inner surface 206 and the second inner surface 210, respectively, (e.g., with connectors such as screws and tapped bosses). Alternatively, the first layer of graphite 124a and the second layer of graphite 214 may be connected to the first inner surface 206 and the second inner surface 210, respectively, via intermediary layers (e.g., layers of thermal adhesive or other layers of thermally conducting material). In other words, the first layer of graphite 124a and the second layer of graphite 214 may be connected and adjacent to the first inner surface 206 and the second inner surface 210, respectively. The first layer of graphite 124a and the second layer of graphite 214 may be connected to the first inner surface 206 and the second inner surface 210, respectively, in any number of other ways.

In FIGS. 2 and 3, portions of the second thermal management module 110b are shown, respectively. The second thermal management module 110b abuts the first layer of graphite 124a via at least the second heat pipe 112b, and the second thermal management module 110b abuts the second layer of graphite 214 via at least the second heat sink 122b.

Other attachments of the second thermal management module 110b, for example, may be provided.

Figure 4:
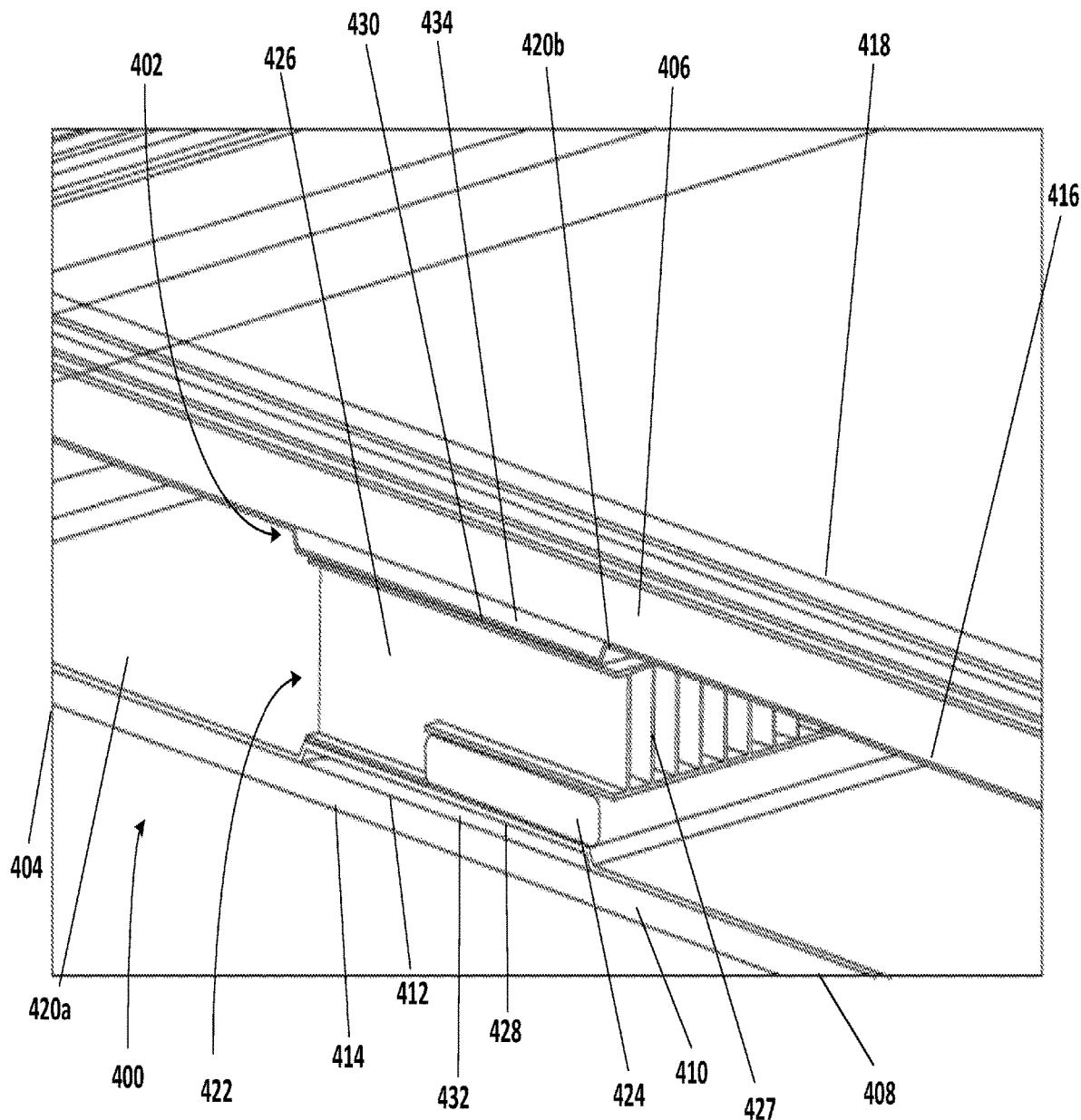
FIG. 4 is a perspective view of a portion of a computing device including an example of a thermal management system.

FIG. 4 is a perspective view of a portion of a computing device 400 including an example of a thermal management system 402. The computing device 400 includes a housing 404. The housing 404 includes a display module 406 and a chassis 408 having a backing layer 410. The chassis 408 has at least one inner surface 412 (e.g., a first inner surface) and at least one outer surface 414 (e.g., a first outer surface). The display module 406 has at least one inner surface 416 (e.g., a second inner surface) and at least one outer surface 418 (e.g., a second outer surface). As described above, the thermal management system 402 includes heat spreaders 420. In the example shown in FIG. 4, the heat spreaders 420 include a first layer of thermally conductive material 420a (e.g., a first layer of graphite) and a second layer of thermally conductive material 420b (e.g., a second layer of graphite). The first layer of graphite 420a abuts the first inner surface 412, and the second layer of graphite 420b abuts the second inner surface 416.

The first layer of graphite 420a and the second layer of graphite 420b help spread heat transferred from a heat generating component supported within the computing device 400 (see FIG. 1) across the chassis 408 and the display module 406, respectively, to optimize thermal efficiency of the computing device 400 (e.g., towards the goal of outer surfaces of the computing device 400 being at an isothermal temperature). To avoid hotspots at the display module 406 and the chassis 408, the first layer of graphite 420a and the second layer of graphite 420b, for example, may be spaced apart from the first inner surface 412 and the second inner surface 416, respectively, where thermal management modules (e.g., a thermal management module 422) of the thermal management system 402 abut the heat spreaders 420 (e.g., the first layer of graphite 420a and/or the second layer of graphite 420b).

For example, as discussed above, the thermal management module 422 may include a phase change device 424 (e.g., a heat pipe) and a heat sink 426 attached to the heat pipe 424. The heat sink 426 includes a plurality of fins 427 that are any number of shapes, sizes, and/or have any number of positions relative to the heat pipe 424. As shown in the example of FIG. 4, the heat pipe 424 and the heat sink 426 abut the first layer of graphite 420a over an area 428 of the first layer of graphite 420a (e.g., a first area), and the heat sink 426 abuts the second layer of graphite 420b over an area 430 of the second layer of graphite 420b (e.g., a second area). At least the first area 428 of the first layer of graphite 420a is spaced apart from (e.g., at a distance from, raised relative to) the first inner surface 412, and at least the second area 430 of the second layer of graphite 420b is spaced apart from (e.g., at a distance from, raised relative to) the second inner surface 416. In other examples, larger or smaller areas than the first area 428 and the second area 430 are spaced apart from the first inner surface 412 and the second inner surface 416, respectively.

In one example, a volume 432 between the first area 428 of the first layer of graphite 420a and the first inner surface 412 (e.g., a first volume) and a volume 434 between the second area 430 of the second layer of graphite 420b and the second inner surface 416 (e.g., a second volume) are filled with air. In another example, the first volume 432 and the second volume 434 are filled with a thermally insulating material. The thermally insulating material may be any number of materials including, for example, a thermally insulating foam. In the example shown in FIG. 4, the volume 432 is filled with air, and volume 434 is filled with the thermally insulating material. In one example, the first volume 432 is filled with a different material than the second volume 434. In another example, one volume of the first volume 432 and the second volume 434 is filled with a thermally insulating material, and the other volume of the first volume 432 and the second volume 434 is filled with air. The first volume 432 and/or the second volume may be filled with more than one material and/or may only be partially filled.

The volumes 432 and 434 also act as gap fillers (i.e., mechanical springs). For example, the first area 428 of the first layer of graphite 420a being raised relative to the first inner surface 412 and the second area 430 of the second layer of graphite 420b being raised relative to the second inner surface 416 force a portion of the thermal management module 422 (e.g., a portion of the phase change device 424 and/or a portion of the heat sink 426 of the thermal management module 422) to abut the heat spreaders 420, respectively. In other words, the raised first area 428 and the raised second area 430, for example, provide clamping on the portion of the thermal management module 422 (e.g., on the portion of the phase change device 424 and the portion of the heat sink 426). This provides efficient thermal conductivity on both sides of the thermal management modules 422.

With the clamping by the raised first area 428 and the raised second area 430, connectors may not be needed to physically connect the portion of the thermal management module 422 to the computing device 400. The clamping provided by raised areas of the heat spreaders 420 may be repeated for additional thermal management modules 422 within the computing device 400.

Figure 5:
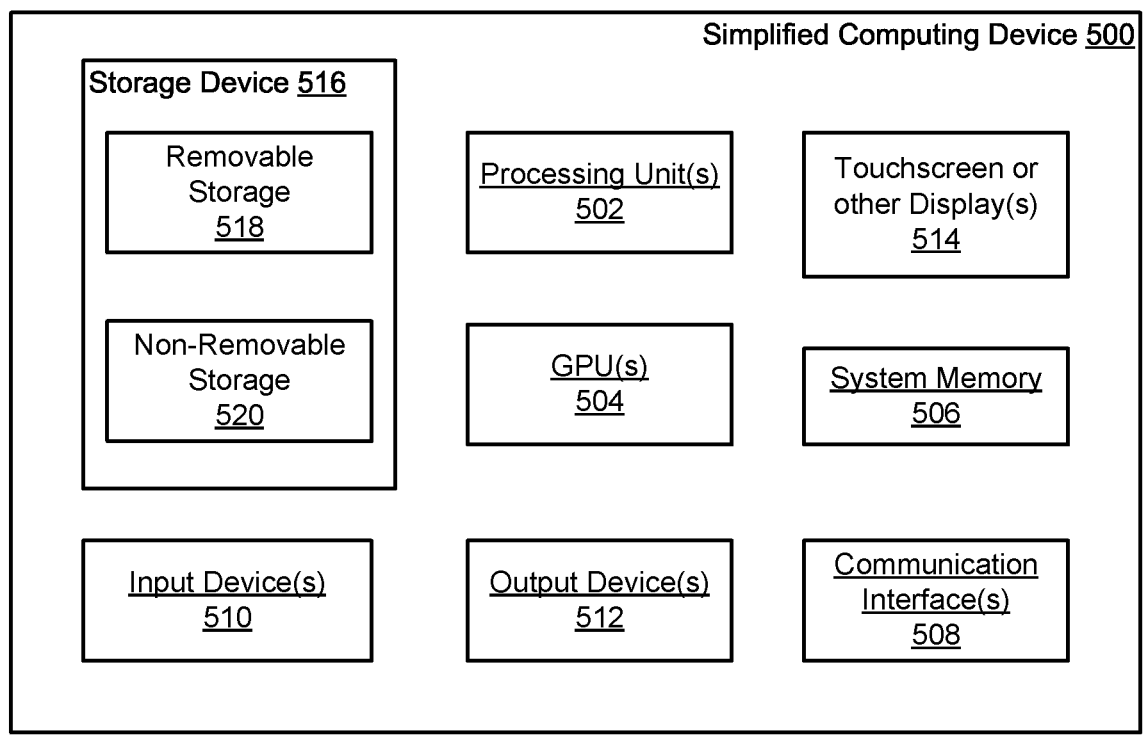
FIG. 5 is a block diagram of a computing environment in accordance with one example for implementation of the disclosed methods or one or more electronic devices.

With reference to FIG. 5, a thermal management system, as described above, may be incorporated within an exemplary computing environment 500. The computing environment 500 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fan).

The computing environment 500 has sufficient computational capability and system memory to enable basic computational operations. In this example, the computing environment 500 includes one or more processing units 502, which may be individually or collectively referred to herein as a processor. The computing environment 500 may also include one or more graphics processing units (GPUs) 504. The processor 502 and/or the GPU 504 may include integrated memory and/or be in communication with system memory 506. The processor 502 and/or the GPU 504 may be a specialized microprocessor, such as a digital signal processor (DSP), a very long instruction word (VLIW) processor, or other microcontroller, or may be a general purpose central processing unit (CPU) having one or more processing cores. The processor 502, the GPU 504, the system memory 506, and/or any other components of the computing environment 500 may be packaged or otherwise integrated as a system on a chip (SoC), application-specific integrated circuit (ASIC), or other integrated circuit or system.

The computing environment 500 may also include other components, such as, for example, a communications interface 508. One or more computer input devices 510 (e.g., pointing devices, keyboards, audio input devices, video input devices, haptic input devices, or devices for receiving wired or wireless data transmissions) may be provided. The input devices 510 may include one or more touch-sensitive surfaces, such as track pads. Various output devices 512, including touchscreen or touch-sensitive display(s) 514, may also be provided. The output devices 512 may include a variety of different audio output devices, video output devices, and/or devices for transmitting wired or wireless data transmissions.

The computing environment 500 may also include a variety of computer readable media for storage of information such as computer-readable or computer-executable instructions, data structures, program modules, or other data. Computer readable media may be any available media accessible via storage devices 516 and includes both volatile and nonvolatile media, whether in removable storage 518 and/or non-removable storage 520. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may accessed by the processing units of the computing environment 500.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a computing device includes a housing having an inner surface, a first outer surface, a second outer surface, and at least one side extending between the first outer surface and the second outer surface. The computing device also includes a heat generating electronic device supported by the housing. The computing device includes a first heat spreader supported by the housing. At least a portion of the first heat spreader abuts or is adjacent to the inner surface of the housing. The computing device also includes a second heat spreader supported by the housing. The second heat spreader extends from a first position within the housing, at or adjacent to the heat generating electronic device to a second position within the housing. The second position is closer to a side of the at least one side of the housing than the first position. A first portion of the second heat spreader abuts the first heat spreader, and a second portion of the second heat spreader is at a distance from the first heat spreader, such that the second portion of the second heat spreader does not abut the first heat spreader.

In a second embodiment, with reference to the first embodiment, the first heat spreader includes a sheet of thermally conductive material, a vapor chamber, or the sheet of thermally conductive material and the vapor chamber.

In a third embodiment, with reference to the second embodiment, the first heat spreader is a sheet of graphite.

In a fourth embodiment, with reference to the second embodiment, the second heat spreader includes a phase change device.

In a fifth embodiment, with reference to the fourth embodiment, the phase change device includes a heat pipe. The second heat spreader includes a heat sink at an end of the heat pipe closest to the second position, the first portion of the second heat spreader including at least part of the heat sink In a sixth embodiment, with reference to the first embodiment, the inner surface is a first inner surface. The housing further has a second inner surface opposite the first inner surface. The computing device further includes a third heat spreader supported by the housing, at least a portion of the third heat spreader abuts or is adjacent to the second inner surface of the housing. The first portion of the second heat spreader abuts the third heat spreader, and the second portion of the second heat spreader is at a distance from the third heat spreader, such that the second portion of the second heat spreader does not abut the third heat spreader.

In a seventh embodiment, with reference to the sixth embodiment, the housing includes a display module and a chassis. The first inner surface and the first outer surface of the housing are a first surface and a second surface of the display module, respectively, and the second inner surface and the second outer surface of the housing are a first surface and a second surface of the chassis, respectively.

In an eighth embodiment, with reference to the first embodiment, the portion of the first heat spreader is a first portion of the first heat spreader. The first heat spreader has a second portion. The second portion of the first heat spreader abuts at least part of the second heat spreader. The second portion of the first heat spreader is at a distance from the inner surface of the housing In a ninth embodiment, with reference to the eighth embodiment, the computing device further includes a layer of thermally insulating material disposed between the inner surface of the housing and the second portion of the first heat spreader.

In a tenth embodiment, with reference to the ninth embodiment, the layer of thermally insulating material is a layer of thermally insulating foam.

In an eleventh embodiment, with reference to the first embodiment, the first heat spreader substantially covers the inner surface of the housing.

In a twelfth embodiment, a computing device includes a housing including a display module and a chassis. The chassis includes a backing layer and at least one side wall extending away from the backing layer. A first inner surface of the housing is a surface of the display module. A second inner surface of the housing is opposite the first inner surface and is a surface of the chassis. The computing device also includes a heat generating electronic device supported by the housing. The computing device includes a first layer of thermally conductive material and a second layer of thermally conductive material. At least a portion of the first layer of thermally conductive material abuts the first inner surface of the housing. At least a portion of the second layer of thermally conductive material abuts the second inner surface of the housing. The computing device also includes a heat spreader extending from a first position within the housing, at or adjacent to the heat generating electronic device to a second position within the housing. The second position is closer to a side wall of the at least one side wall of the housing than the first position. A first portion of the heat spreader abuts the first layer of thermally conductive material and the second layer of thermally conductive material, and a second portion of the heat spreader is spaced apart from the first layer of thermally conductive material and the second layer of thermally conductive material, respectively, such that the second portion of the heat spreader does not abut the first layer of thermally conductive material or the second layer of thermally conductive material.

In a thirteenth embodiment, with reference to the twelfth embodiment, the first layer of thermally conductive material and the second layer of thermally conductive material are layers of graphite, respectively.

In a fourteenth embodiment, with reference to the twelfth embodiment, the heat spreader includes a phase change device. The phase change device has a first end and a second end between which the phase change device extends. The first end of the phase change device is at or adjacent to the heat generating electronic device.

In a fifteenth embodiment, with reference to the fourteenth embodiment, the heat spreader includes a heat sink at or adjacent to the second end of the phase change device.

In a sixteenth embodiment, with reference to the fifteenth embodiment, a portion of the phase change device abuts the second layer of thermally conductive material. The heat sink abuts the first layer of thermally conductive material and the second layer of thermally conductive material In a seventeenth embodiment, with reference to the fourteenth embodiment, the phase change device includes a heat pipe, a vapor chamber, or the heat pipe and the vapor chamber.

In an eighteenth embodiment, with reference to the twelfth embodiment, the portion of the second layer of thermally conductive material is a first portion of the second layer of thermally conductive material. The second layer of thermally conductive material has a second portion. The second portion of the second layer of thermally conductive material abuts the heat spreader. The second portion of the second layer of thermally conductive material is at a distance from the second inner surface of the housing. The computing device further includes a layer of thermally insulating material disposed between the second inner surface of the housing and the second portion of the second layer of thermally conductive material.

In a nineteenth embodiment, a thermal management system includes a first heat spreader, a second heat spreader, a first thermal management device, and a second thermal management device. The first thermal management device includes a first phase change device. The first phase change device extends from a first position relative to the heat first spreader and the second heat spreader to a second position relative to the first heat spreader and the second heat spreader. The second thermal management device includes a second phase change device. The second phase change device extends from a third position relative to the first heat spreader and the second heat spreader to a fourth position relative to the first heat spreader and the second heat spreader. A first portion of the first thermal management device abuts the first heat spreader and the second heat spreader, and a second portion of the first management device is spaced apart from the first heat spreader and the second heat spreader, such that the second portion of the first thermal management device does not abut the first heat spreader or the second heat spreader. A first portion of the second thermal management device abuts the first heat spreader and the second heat spreader, and a second portion of the second thermal management device is spaced apart from the first heat spreader and the second heat spreader, such that the second portion of the second thermal management device does not abut the first heat spreader or the second heat spreader.

In a twentieth embodiment, with reference to the nineteenth embodiment, the first heat spreader is a first layer of graphite, and the second heat spreader is a second layer of graphite. The first thermal management device further includes a first heat sink attached to the first phase change device at, adjacent to, or at and adjacent to an end of the first phase change device, and the second thermal management device further includes a second heat sink attached to the second phase change device at, adjacent to, or at and adjacent to an end of the second phase change device. The first heat sink abuts the first layer of graphite and the second layer of graphite, and the first heat pipe abuts the first layer of graphite or the second layer of graphite. The second heat sink abuts the first layer of graphite and the second layer of graphite, and the second heat pipe abuts the first layer of graphite or the second layer of graphite.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:
1. A computing device comprising:
  a housing comprising:
    a chassis having an inner surface; and
    a display coupled to the chassis and having an inner surface;
  a heat source enclosed in the housing; and
  a heat spreader, wherein a first side of the heat spreader is attached to the inner surface of the chassis and a second side of the heat spreader is spaced a distance apart from the chassis and attached to the inner surface of the display, the first side is opposite the second side, and wherein the heat source is thermally connected with the heat spreader.

2. The computing device of claim 1, wherein the heat spreader includes a sheet of thermally conductive material, a vapor chamber, or the sheet of thermally conductive material and the vapor chamber.

3. The computing device of claim 1, wherein the heat spreader includes a thermal module, and wherein the heat source is thermally connected with the heat spreader via the thermal module, the thermal module including a heat pipe.

4. The computing device of claim 3, wherein the thermal module further includes a heat sink connected to the heat pipe.

5. The computing device of claim 1, wherein the heat spreader spans at least one side of the housing so as to transfer heat from the heat source to a periphery of the housing.

6. The computing device of claim 1, further comprising a layer of insulating material between the inner surface of the chassis and a portion of the first side of the heat spreader so as to prevent a hot spot at a location of the chassis corresponding to the insulating material.

7. The computing device of claim 1, wherein a volume between the second side of the heat spreader and the inner surface of the display is filled with a thermally insulating foam so as to prevent a hot spot at a location of the display corresponding to the foam.

8. The computing device of claim 1, wherein the heat spreader spans between the inner surface of the chassis and the opposite inner surface of the display.

9. A computing device comprising:
   a housing including a first inner surface and a second inner surface opposite the first inner surface;
   a heat generating component positioned within the housing;
   a first heat spreader thermally coupled to the heat generating component, wherein a first portion of the first heat spreader is thermally insulated from an interior portion of the first inner surface of the housing and is attached to a peripheral portion of the first inner surface of the housing; and
   a second heat spreader thermally communicating heat from the heat generating component to the first heat spreader, and wherein the heat generating component does not abut the first heat spreader.

10. The computing device of claim 9, wherein the computing device includes a tablet computing device, and the housing includes a tablet bottom, the first heat spreader contacting at least a part of a tablet bottom inner surface and a third heat spreader contacting at least a part of a display inner surface, the second heat spreader thermally communicating heat from the heat generating component to the third heat spreader.

11. The computing device of claim 10, wherein the tablet bottom inner surface and the display inner surface are opposite each other.

12. The computing device of claim 11, wherein the second heat spreader comprises a heat sink physically connected to the first heat spreader and the third heat spreader.

13. The computing device of claim 9, wherein the second heat spreader comprises one or more heat pipes.

14. The computing device of claim 9, wherein the second heat spreader comprises a heat sink.

15. The computing device of claim 9, wherein a first end of the second heat spreader is in abutting physical contact with the heat generating component and a second end of the second heat spreader is in abutting physical contact with the first heat spreader.

16. The computing device of claim 9, wherein the heat generating component is a first heat generating component, and further comprising:
   a second heat generating component;
   a third heat spreader, wherein a third heat spreader portion is attached to the inner surface of the housing; and
   a fourth heat spreader thermally communicating heat from the second heat generating component to the third heat spreader, and wherein the second heat generating component does not abut the third heat spreader.

17. A method for thermal management in a computing device, the method comprising:
   transferring heat from a heat source to a first heat spreader on an inner surface of a chassis via a second heat spreader, wherein the heat source does not abut the first heat spreader;
   transferring heat from the heat source to a third heat spreader on an inner surface of a display via the second heat spreader; and
   spreading the heat from the first heat spreader to the chassis and from the third heat spreader to the display, the first heat spreader attached to the chassis wherein the heat is dissipated substantially isothermally across the chassis.

18. The method of claim 17, wherein transferring the heat from the heat source includes directly conducting the heat to the second heat spreader.

19. The method of claim 18, wherein transferring the heat from the heat source includes changing the phase of a fluid over a distance between the heat source and the first heat spreader.

20. The method of claim 18, wherein directly conducting the heat to the second heat spreader is optimized to isothermally spread the heat across the chassis.

* * * * *